United States Patent
Yen et al.

(10) Patent No.: US 7,226,873 B2
(45) Date of Patent: Jun. 5, 2007

(54) METHOD OF IMPROVING VIA FILLING UNIFORMITY IN ISOLATED AND DENSE VIA-PATTERN REGIONS

(75) Inventors: Yung-Sung Yen, Jhonghe (TW); Kuei-Shun Chen, Hsinchu (TW); Chia-Hsiang Lin, Hsinchu (TW); Lawrence Lin, Jhonghe (TW); Tsung Hsien Lin, Sun Chung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 265 days.

(21) Appl. No.: 10/992,668

(22) Filed: Nov. 22, 2004

(65) Prior Publication Data

US 2006/0110941 A1   May 25, 2006

(51) Int. Cl.
*H01L 21/31* (2006.01)
*H01L 21/469* (2006.01)

(52) U.S. Cl. ...................... 438/781; 438/694; 438/672; 438/681; 257/E21.257; 257/E21.026; 257/E21.259

(58) Field of Classification Search ................ 438/781; 257/E21.259
See application file for complete search history.

(56) References Cited

U.S. PATENT DOCUMENTS

| 6,486,058 | B1 * | 11/2002 | Chun .......................... 438/637 |
| 6,645,851 | B1 | 11/2003 | Fu et al. |
| 6,767,833 | B2 * | 7/2004 | Shih et al. ................... 438/706 |
| 7,094,711 | B2 * | 8/2006 | Chang et al. ................ 438/781 |

\* cited by examiner

Primary Examiner—B. William Baumeister
Assistant Examiner—Igwe U. Anya
(74) Attorney, Agent, or Firm—Birch, Stewart, Kolasch & Birch, LLP (57) ABSTRACT

An isotropic-diffusion filling method uses a thermal process on a result structure comprising a photoresist layer and an organic material layer to create a cross-linking layer there between, which minimizes step height differences between isolated and dense via-pattern regions for optimizing a subsequent trench process and simplifying process steps.

24 Claims, 10 Drawing Sheets

METHOD OF IMPROVING VIA FILLING UNIFORMITY IN ISOLATED AND DENSE VIA-PATTERN REGIONS

FIELD OF THE INVENTION

The present invention relates to fabrication of integrated circuits and other electronic devices, and particularly to an isotropic-diffuse via filling method for improving via filling uniformity in isolated and dense via-pattern regions.

BACKGROUND OF THE INVENTION

Microelectronic integrated circuits (ICs) based on patterned semiconductor materials are continuing to evolve towards devices with an extremely high density of circuit elements per unit volume. The use of copper (Cu), with twice the conductivity of aluminum and three times the conductivity of tungsten, has been replaced as the interconnect material in advanced ICs manufacture using either single inlay or dual damascene processes. The conventional method of patterning trenches in a via-first dual damascene process involves filling via openings with an organic bottom anti-reflective coating (BARC), applying a photoresist layer on the via plug and then performing trench lithography, but a large filling bias between the isolated and dense (iso-dense) via plugs is usually observed. It is always challenging to optimize the subsequent trench recipe due to uneven filling of the iso-dense via plugs, thus the trench is incompletely etched leaving a fence of unetched resinous material around the via plug. In one approach to the problem of step height differences in the iso-dense via plugs, an extra step of etch back is needed to minimize the iso-dense via filling variation of organic materials, but complex procedures and high process costs are accompanied. U.S. Pat. No. 6,645,851 to Ho et al, describing a method of forming a planarized photoresist coating on contact holes with different duty ratios, is incorporated herein by reference.

SUMMARY OF THE INVENTION

It is an object of the present invention to provide a via filling method to improve filling uniformity in isolated and dense via-pattern regions.

It is another object of the present invention to provide a trench filling method for a bottle-shaped trench process.

It is another object of the present invention to provide an isotropic-diffuse filling method using a thermal process on an organic material layer overlying a photoresist layer while simplifying process steps and reducing process costs.

To achieve the above objectives, the present invention provides a method of filling openings patterned on a semiconductor substrate. A photoresist layer is formed on the semiconductor substrate to partially fill the opening. An organic material layer is formed on the photoresist layer to completely fill the opening. A thermal process is performed to form a cross-linking layer between the organic material layer and the photoresist layer. The cross-linking layer is the reacted portion of the organic material layer. The cross-linking layer combines with the photoresist layer to completely fill the opening and serve as a sacrificial filling material layer. The unreacted portion of the organic material layer is removed from the sacrificial filling material layer.

To achieve the above objectives, the present invention provides a method of filling via openings for reducing step height difference between isolated and dense via-pattern regions. A semiconductor substrate has at least one first via opening in an isolated via-pattern region of a relative low via-pattern density and at least one second via opening in a dense via-pattern region of a relative high via-pattern density. A photoresist layer is formed on the semiconductor substrate to partially fill the first via opening and the second via opening. An organic material is formed on the photoresist layer to completely fill the first via opening and the second via opening. A thermal process is performed to form a cross-linking layer between the organic material layer and the photoresist layer. The cross-linking layer is the reacted portion of the organic material layer. The cross-linking layer combines with the photoresist layer to serve as a sacrificial filling material layer which completely fills the first via opening and the second via opening and minimizes the step height difference between the isolated via-pattern region and the dense via-pattern region. The unreacted portion of the organic material layer is removed from the sacrificial filling material layer.

To achieve the above objectives, the present invention provides a method of filling trenches for a bottle-shaped trench process. A semiconductor substrate has at least one trench etched into the semiconductor substrate. A photoresist layer is formed on the semiconductor substrate to partially fill the trench. An organic material is formed on the photoresist layer to completely fill the trench. A thermal process is performed to form a cross-linking layer between the organic material layer and the photoresist layer. The cross-linking layer is the reacted portion of the organic material layer. The cross-linking layer combines with the photoresist layer to serve as a sacrificial filling material layer that completely fills the trench. The unreacted portion of the organic material layer is removed from the sacrificial filling material layer. The sacrificial filling material layer is partially removed from an upper region of the trench to expose a sidewall at the upper region of the trench. A dielectric spacer is formed on the exposed sidewall of the trench. The sacrificial filling material layer is removed from a lower region of the trench to expose a sidewall at the lower region of the trench.

BRIEF DESCRIPTION OF THE DRAWINGS

The aforementioned objects, features and advantages of this invention will become apparent by referring to the following detailed description of the preferred embodiment with reference to the accompanying drawings, wherein.

DESCRIPTION OF THE PREFERRED EMBODIMENTS

The present invention provides an isotropic-diffusion filling method using a thermal process on a result structure comprising an organic material layer and a photoresist layer to create a cross-linking layer there between, which minimizes the step height difference between isolated and dense (iso-dense) via-pattern regions for optimizing a subsequent trench process and overcomes the aforementioned problems of the prior art arising from the use of one or more etch back processes. As will be appreciated by persons skilled in the art from discussion herein, one application is used for a dual damascene process, preferably a via-first dual damascene process. The other application is used for a deep trench process, preferably a bottle-shaped trench process.

Hereinafter, reference will now be made in detail to the present preferred embodiments of the invention, examples of which are illustrated in the accompanying drawings. Wherever possible, the same reference numbers are used in the drawings and the description to refer to the same or like parts. In the drawings, the shape and thickness of an embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be presented. In the context of this disclosure, the terms "dense" and "density" refer to the feature (e.g., wiring structures, plugs, via openings, and other active and passive elements) density of a specific area of a semiconductor device or workpiece. For example, a more dense area of a semiconductor device will have a larger portion of the area occupied by feature(s) located in the particular area than a less dense area of the device.

In an exemplary embodiment of the present invention, a manufacturing method of filling iso-dense via openings with a sacrificial filling material layer for a via-first dual damascene process will be illustrated in cross-sectional diagrams of FIGS. 1A to 1I.

Figure 1A:
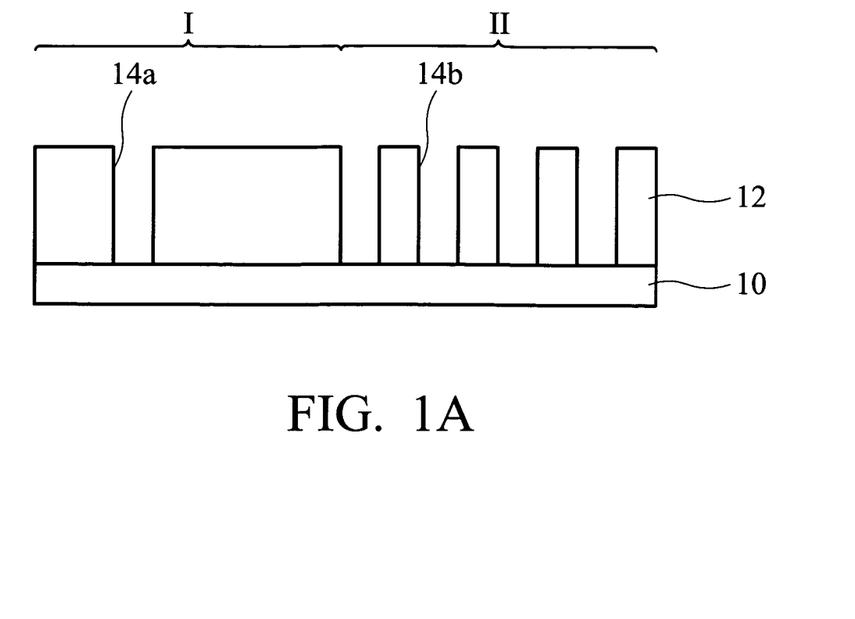
FIGS. 1A to 1I are cross-sectional diagrams illustrating a method of filling iso-dense via openings with a sacrificial filling material layer for a via-first dual damascene process.

In FIG. 1A, an example of a semiconductor substrate 10 used for interconnection fabrication is provided with an inter-metal-dielectric (IMD) layer 12 patterned thereon. The semiconductor substrate 10 comprises a substrate as employed in a semiconductor integrated circuit fabrication, and integrated circuits may be formed therein and/or thereupon. The term "semiconductor substrate" is defined to mean any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. The semiconductor substrate 10 may comprise conductive regions, which are portions of conductive routs and have exposed surfaces treated by a planarization process, such as chemical mechanical polishing. Suitable materials for the conductive regions may include, but not limited to, for example copper, aluminum, copper alloy, or other mobile conductive materials. The conductive regions are omitted in the drawings for clarity and convenience.

The IMD layer 12 reaches to a thickness of about 1000 angstroms to about 30000 angstroms through any of a variety of techniques, including, spin coating, CVD, and future-developed deposition procedures. The IMD layer 12 may be formed of $SiO_2$, carbon-doped $SiO_2$, a comparatively low dielectric constant dielectric material with a k value less than about 4.0, or combinations thereof. A wide variety of low-k materials may be employed in accordance with embodiments of the present invention, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In one embodiment, an etch stop layer of silicon nitride, silicon carbide, silicon oxide or silicon oxynitride may be optionally formed underlying the IMD layer 12 through any of a variety of techniques, including, CVD, PECVD, PVD, and future-developed deposition procedures. In one embodiment, a passivation layer of silicon nitride, silicon oxynitride, silicon carbide or silicon oxide may be optionally formed on the IMD layer 12 through any of a variety of techniques, including, CVD, PECVD, PVD, and future-developed deposition procedures.

Referring to FIG. 1A, a plurality of via openings 14a and 14b is formed in the IMD layer 12 to expose portions of the semiconductor substrate 10, such as corresponding conductive regions. The via openings 14a and 14b are formed with various via-pattern densities depending on the device pattern. The term "via-pattern density" is defined as the area occupied by via openings divided by the total area of the via openings and the space between the via openings. The via opening 14a is formed in an isolated via-pattern region I with a via-pattern density approaching about 0 to 0.3. The via opening 14b is formed in a dense via-pattern region II with a via-pattern density greater than about 0.5. The via openings 14a and 14b may be formed using a typical lithographic and anisotropic etching operation (e.g., plasma etching or reactive ion etching) to transfer the openings in a photoresist layer through the IMD layer 12.

Figure 1B:
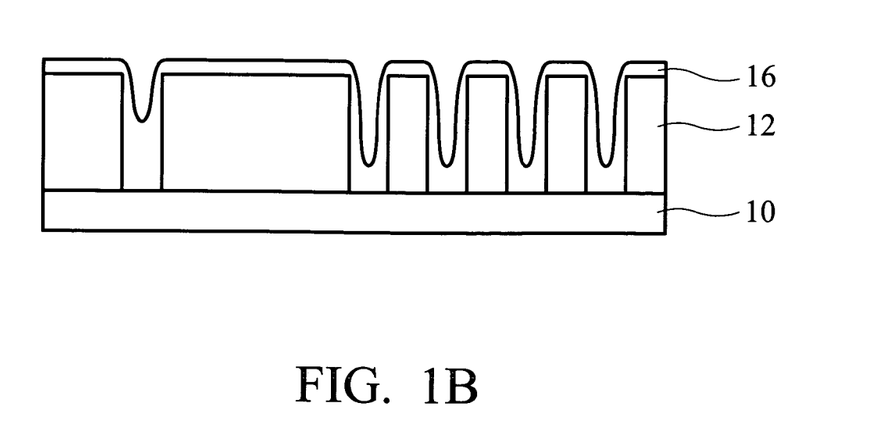

In FIG. 1B, a photoresist layer 16 is coated on the IMD layer 12 to reach a predetermined thickness. Depending on the thickness control, the film profile is relatively dependent of the angles or relative heights of topographic features on the substrate, e.g., partially filling the via openings 14a and 14b and leaving recesses, and the unfilled portions will be completely filled in subsequent processes which is described below in detail. In one embodiment, the photoresist layer 16 is an I-line photoresist, which normally includes a Novolac resin prepared by reacting a cresol, xylenol, or other substituted phenols with formaldehyde. In one embodiment, the photoresist layer 16 is a deep UV (ultra-violet) photoresist. The deep UV photoresist is typically comprised of polymers having hydroxystyrene groups. The photoresist layer 16 may be formed from either a positive tone or negative tone photoresist. Alternatively, the photoresist layer 16 is conveniently one that is already used in the manufacturing line in order to avoid the cost of implementing new materials.

Figure 1C:
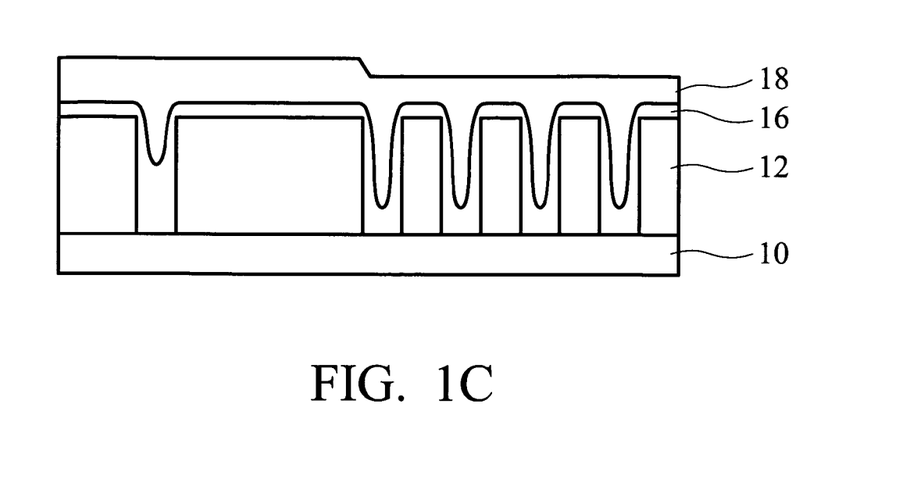

After baking the photoresist layer 16, an organic material layer 18 is coated on the photoresist layer 16 to fully fill the via openings 14a and 14b, as shown in FIG. 1C. The top surface of the organic material layer 18 is higher than the top surface of the IMD layer 12, and preferably higher than the top surface of the photoresist layer 16. Any suitable water soluble organic over-coating material that substantially reacts with the photoresist layer 16 at baking temperature and thus substantially forms an cross-linking layer with the photoresist layer 16 can be used to implement the present invention. The organic material layer 18 may be formed of RELACS (Resolution Enhancement Lithography Assisted by Chemical Shrink) material or WASOOM (a water-soluble organic over-coating material). The RELACS material is an available agent made of water-soluble resin and a binding agent and is commercialized by Clariant Co., which is for use of enhancing the process window of line/space dense pattern in sub-wavelength process. U.S. Pat. No. 6,632,590 to Tzu et al is incorporated herein by reference. The present invention intends to improve filling uniformity of by using the RELACS material. The WASOOM is commercialized by NFC-540 from JSR Microelectronics, which is for use of shrinking the size of the contact hole. U.S. Pat. No. 6,486,058 to Jun-Sung Chun is incorporated herein by reference. The WASOOM may include, but is not limited to, poly vinyl alcohol, carbazol, poly vinyl pyrrolidone, quaternary ammonium, sulphonium salt, $C_2$-$C_{10}$ alkane diols, guanidine, glycolic acid and glycolate salts, lactic acid and lactate salts, polyhydroxy alcohols, polyethylene glycol, sugar and starch, sugar and starch derivatives, panthenol, pyrrolidone carboxylic acid, hyaluronic acid, lactamide monoethanolamine, acetamide monoethanolamine, urea, ethanol amines of the general structure $(HOCH_2CH_2)_xNH_y$, a phosphate ester, alcohol, fatty acid including mono-, di-, tri-, and polyacids, fatty acid derivatives, or mixtures thereof.

Figure 1D:
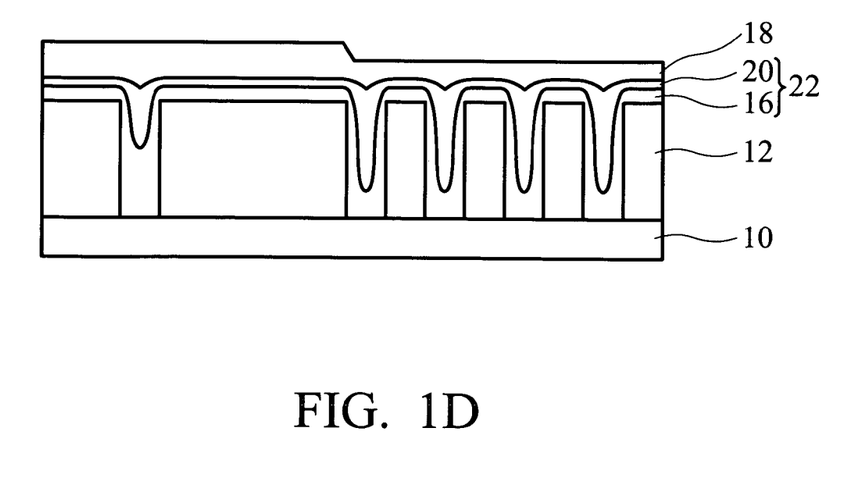
Figure 1E:
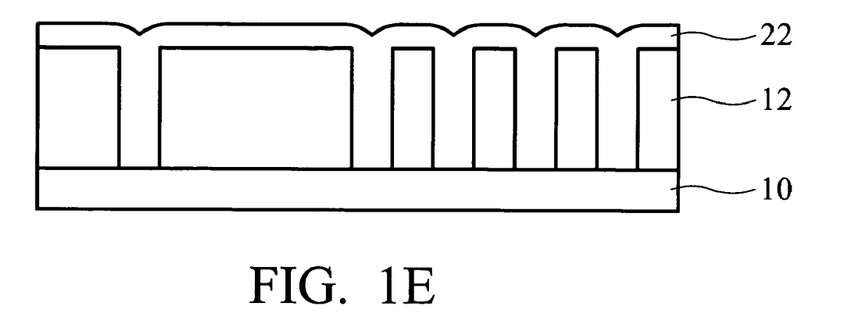

Next in FIG. 1D, by a thermal process through a variety of heat treatment techniques, e.g., baking at 50° C.~200° C. over a period of time, cross-linking is established whereby acid from the photoresist layer 16 combines with the organic material layer 18 and forms a cross-linking layer 20. The cross-linking layer 20 combined with the photoresist layer 16, hereinafter, is referred to as a sacrificial filling material layer 22. After that, the unreacted portions where the organic material layer 18 is not combined are washed off through a rinsing process with a hydrophilic developing solution, such as DI water, TMAH-containing solution, alkyl alcohol, or mixtures thereof. As a result shown in FIG. 1E, the sacrificial filling material layer 22 substantially forms a planar profile over the top surface of the IMD layer 12 and has a thickness from about 10 Angstroms to 5000 Angstroms above the top surface of the IMD layer 12.

Figure 1F:
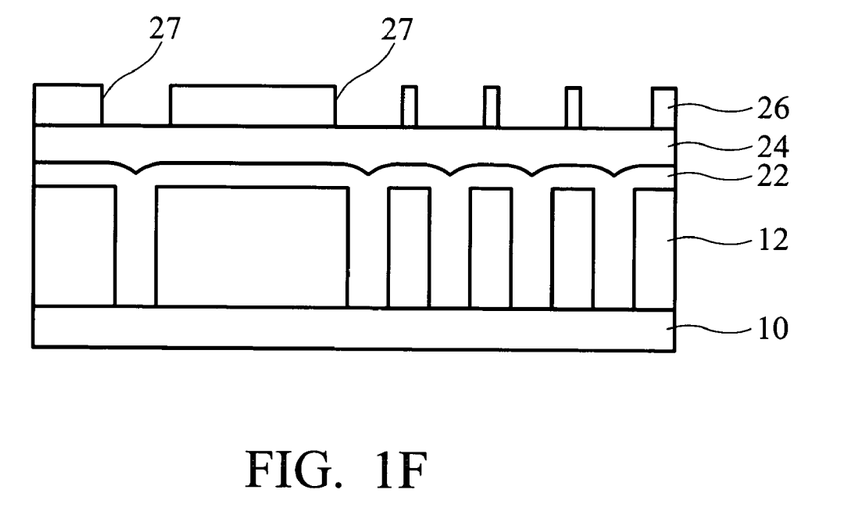
Figure 1G:
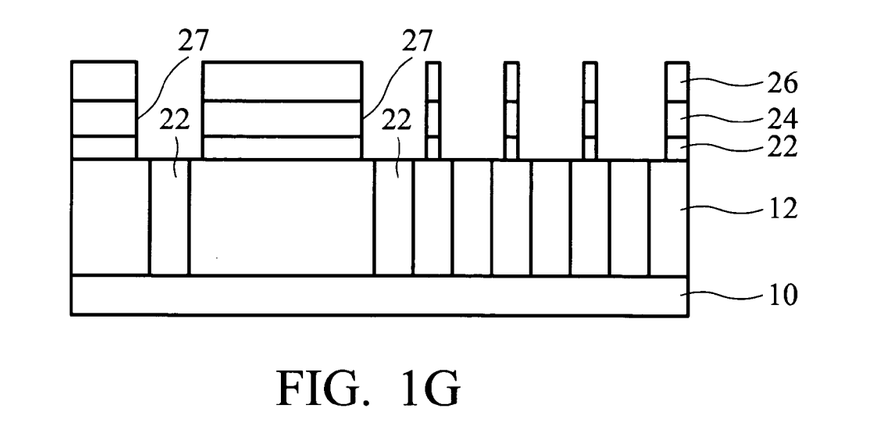

In FIG. 1F, a bottom anti-reflective coating (BARC) layer 24 is formed on the sacrificial filling material layer 22 by spin coating a commercially available material from suppliers like Shipley Company, JSR, TOK, Hoechst, and Brewer. The BARC layer 24 may be baked above 200° C. to make it immiscible with organic solvents. A patterned photoresist layer 26 with a plurality of trench openings 27 is then formed on the BARC layer 24. In FIG. 1G, advances in lithography and masking techniques and etch processes, transfer the trench openings 27 through the BARC layer 24 and the sacrificial filling material layer 22 to substantially reach the top of the IMD layer 12.

Figure 1H:
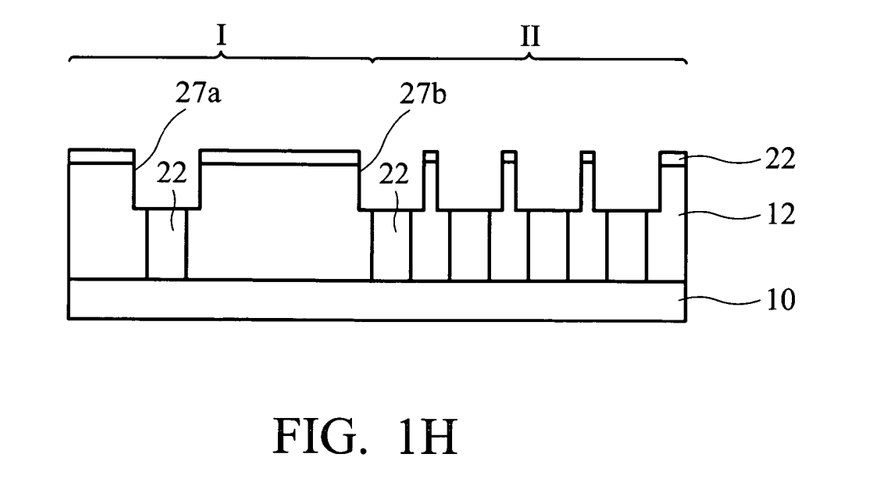
Figure 1I:
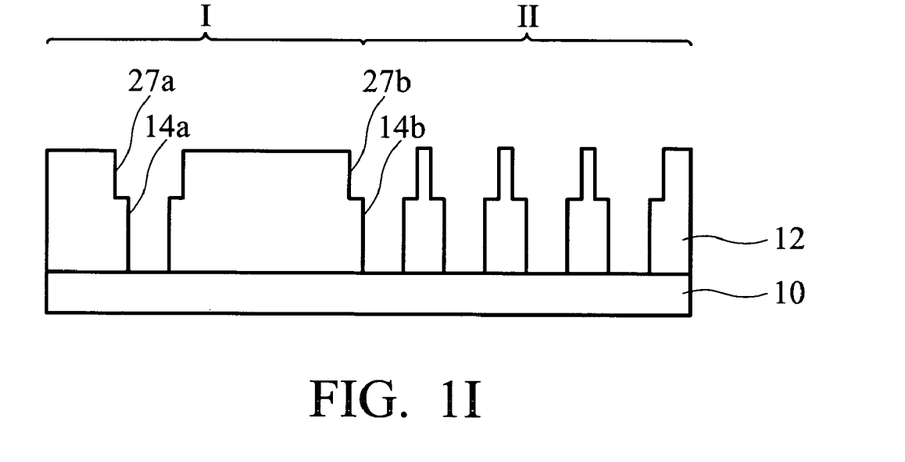

In FIG. 1H, the exposed portions of the IMD layer 12 and the sacrificial filling material layer 22 are etched to complete trenches 27a and 27b at the upper regions of the via openings 14a and 14b, respectively. During the etch process through the IMD layer 12, the patterned photoresist layer 26 and the BARC layer 24 are typically consumed and the level of the sacrificial filling material layer 22 in the via openings 14a and 14b is reduced. Finally, in FIG. 1I, the remaining portions of the sacrificial filling material layer 22 are stripped in a wet solution (e.g., $H_2SO_4$ and $H_2O_2$) from the lower portions of the via openings 14a and 14b, thus completing dual damascene openings in the isolated via-pattern region I and the dense via-pattern region II.

The manufacturing method of filling iso-dense via openings for a dual damascene process has advantages over prior art, in which the isotropic-diffusion via filling technique creates a cross-linking layer between a organic material layer and a photoresist layer through a thermal process to minimize the step height difference between isolated and dense via-pattern regions for optimizing the subsequent trench process. Compared with the conventional use of etch back process, the present invention uses dual resist coatings, baking and developing to improve iso-dense via filling uniformity, thus the process steps are simplified and the process costs are reduced.

Figure 2A:
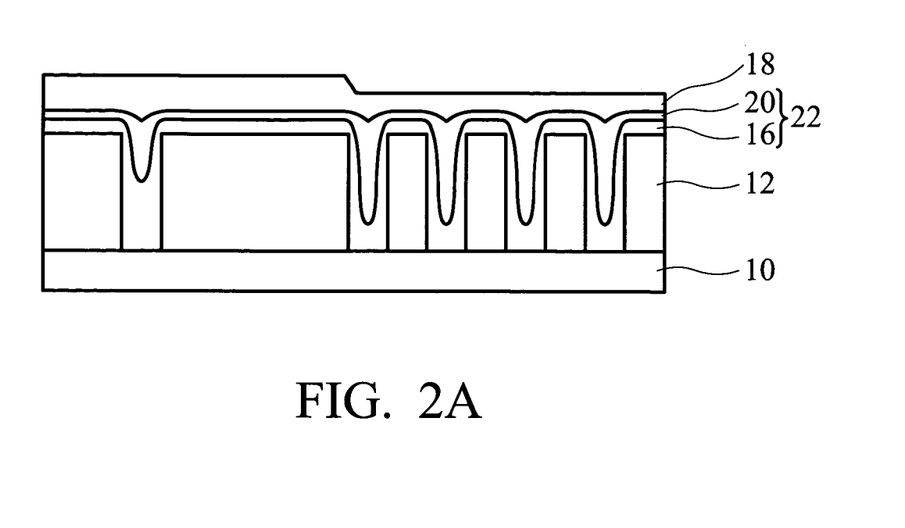
FIGS. 2A to 2C are cross-sectional diagrams illustrating an exemplary embodiment of filling iso-dense via openings for a via-first dual damascene process.
Figure 2B:
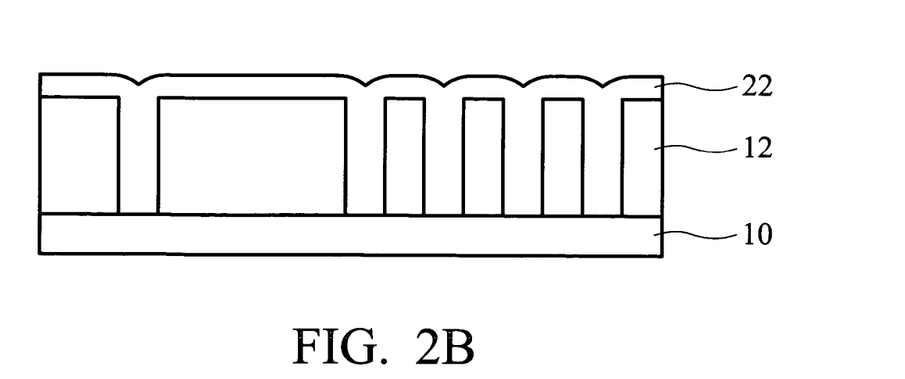
Figure 2C:
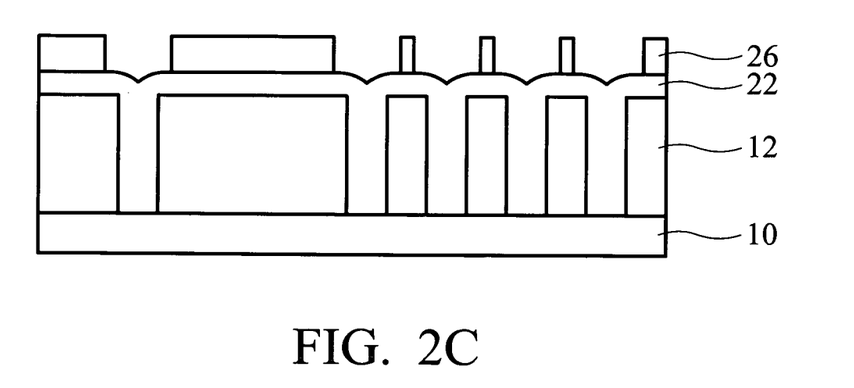

FIGS. 2A to 2C are cross-sectional diagrams illustrating an exemplary embodiment of filling iso-dense via openings for a via-first dual damascene process, while explanation of the same or similar portions to the description in FIGS. 1A to 1I will be omitted. Compared with the method described in FIG. 1F, the sacrificial filling material layer 22 over the level of the via openings 14a and 14b can act as a BRAC layer, thus the step of forming the BARC layer 24 is omitted in FIG. 2C. This further simplifies the process steps and reduces the process costs.

In another exemplary embodiment of the present invention, a manufacturing method of filling trenches for a bottle-shaped deep trench process will be illustrated in cross-sectional diagrams of FIGS. 3A to 3E.

Figure 3A:
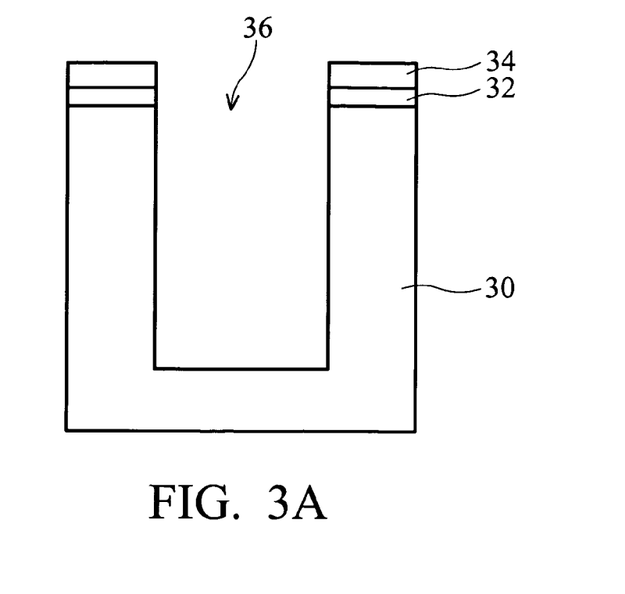
FIGS. 3A to 3F are cross-sectional diagrams illustrating an exemplary embodiment of filling trenches for a bottle-shaped deep trench process.

In FIG. 3A, a semiconductor substrate 30, such as a silicon substrate, is provided with a pad oxide layer 32 and a pad nitride layer 34 which are used as a mask for etching a deep trench 36 into the semiconductor substrate 30. The deep trench 36 is defined through lithography and masking techniques and dry etch processes to reach a predetermined depth about 4 μm to 6 μm. In addition, a conformal liner layer, such as silicon oxide, silicon nitride or a combination thereof, may be optionally formed along the bottom and sidewalls of the deep trench 36.

Figure 3B:
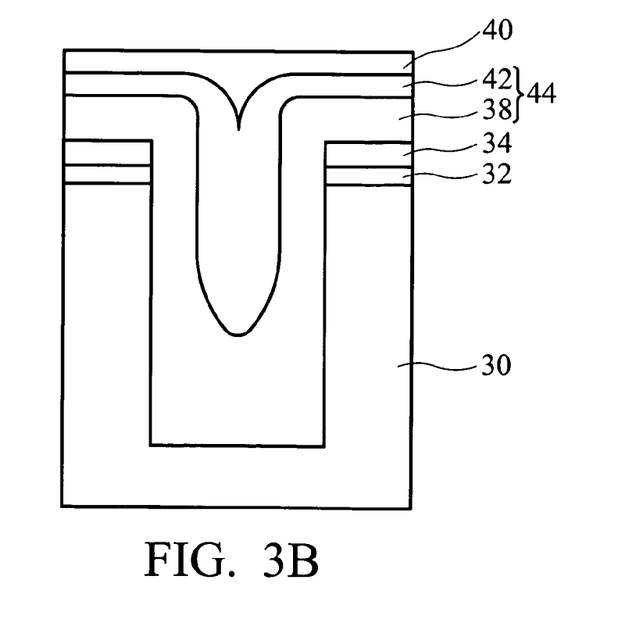
Figure 3C:
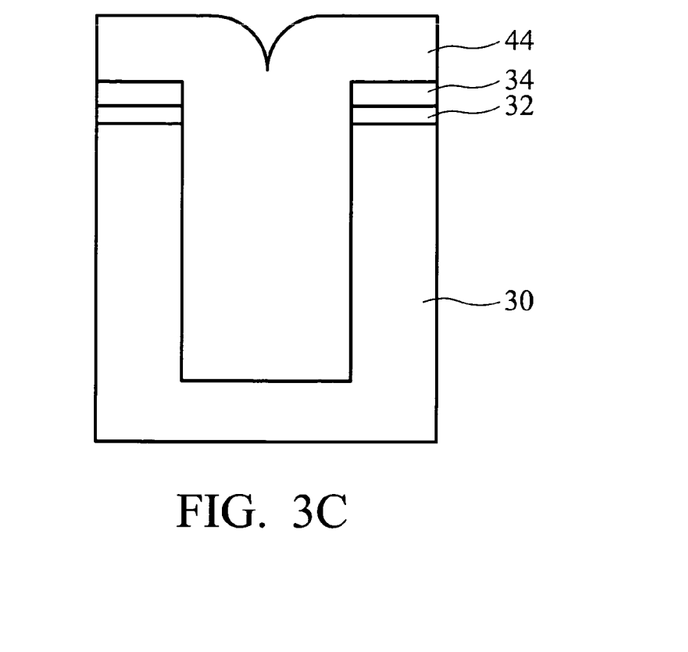

In FIG. 3B, a photoresist layer 38 is coated on the semiconductor substrate 30 to partially fill the deep trench 36. The photoresist layer 38 may include I-line photoresist, deep UV photoresist, or any convenient one that is already used in the manufacturing line in order to avoid the cost of implementing new materials. An organic material layer 40 is then coated on the photoresist layer 38 to fully fill the deep trench 36. The top surface of the buffer layer 40 is higher than the level of the deep trench 36, and preferably higher than the top surface of the photoresist layer 38. Any suitable water soluble organic over-coating material that substantially reacts with the photoresist layer 38 at baking temperature and thus substantially forms an cross-linking layer with the photoresist layer 38 can be used to implement the present invention. The organic material layer 40 may be formed of RELACS (Resolution Enhancement Lithography Assisted by Chemical Shrink) agent or WASOOM (a water-soluble organic over-coating material). By heat treatment techniques, e.g., baking at 50° C.~200° C. over a period of from several tens of seconds to one hundred and several tens of seconds, cross-linking is established whereby acid from the photoresist layer 38 combines with the organic material layer 40 and forms a cross-linking layer 42. The cross-linking layer 42 combined with the photoresist layer 38, hereinafter, is referred to as a sacrificial filling material layer 44. After that, the unreacted portions where the buffer layer 40 is not combined are washed off, as a result shown in FIG. 3C. The sacrificial filling material layer 44 substantially forms a planar profile over the pad nitride layer 34.

Figure 3D:
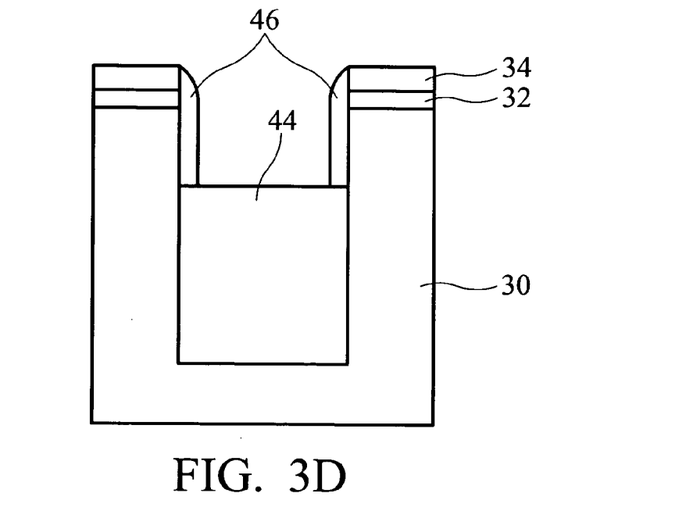
Figure 3E:
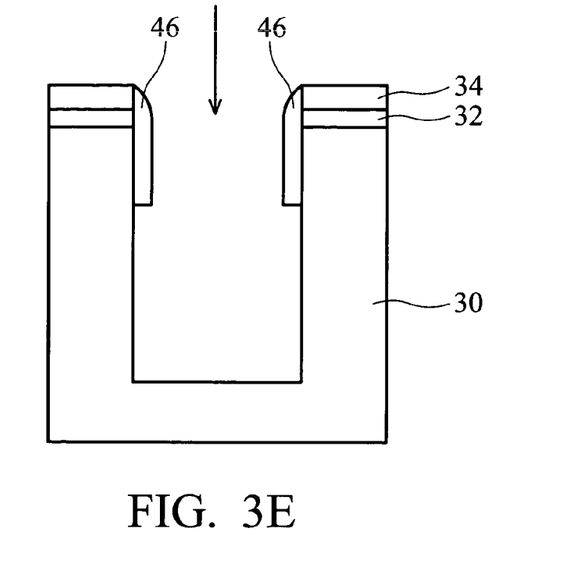
Figure 3F:
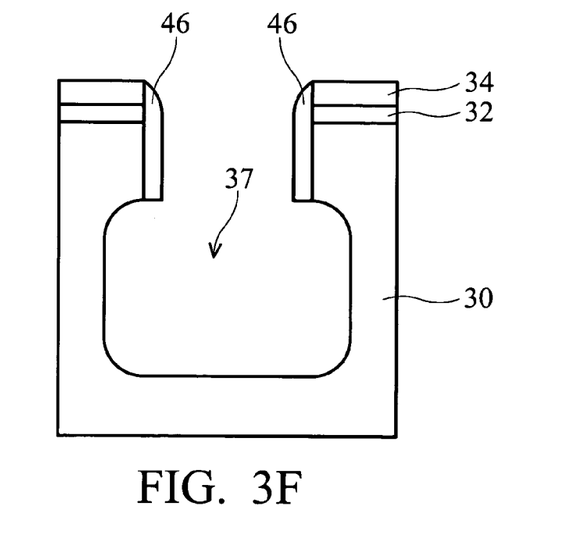

In FIG. 3D, the sacrificial filling material layer 44 in the deep trench 36 is etched to a predetermined depth of from about 1 μm to about 2 μm by anisotropic etching (e.g., plasma etching or RIE) or isotropic etching (e.g., wet etching). Next, advances in deposition, lithography and masking techniques and dry etch processes, allow production of dielectric spacers 46 on the exposed sidewalls of the deep trench 36. The dielectric spacer 46 may include silicon oxide, silicon nitride, or a combination thereof. Referring to FIG. 3E, the remaining portion of the sacrificial filling material layer 44 is then removed from the deep trench 36 by the use of isotropic etching with the dielectric spacers 46 as the etching mask. Finally, in FIG. 3F, the lower portion of deep trench 36 unmasked by the dielectric spacers 46 is isotropically etched to form a bottle-shaped trench 37.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A method of filling openings, comprising:
   providing a semiconductor substrate having at least one opening;
   forming a photoresist layer on said semiconductor substrate to partially fill said opening;
   forming an organic material layer on said photoresist layer to completely fill said opening;
   performing a thermal process to form a cross-linking layer between said organic material layer and said photoresist layer;
      wherein, said cross-linking layer is the reacted portion of said organic material layer; and
      wherein, said cross-linking layer combines with said photoresist layer to completely fill said opening and serve as a sacrificial filling material layer; and
   removing the unreacted portion of said organic material layer from said sacrificial filling material layer.

2. The of method of claim 1, wherein said organic material layer comprises WASOOM (water-soluble organic over-coating material).

3. The of method of claim 1, wherein said organic material layer comprises RELACS (Resolution Enhancement Lithography Assisted by Chemical Shrink) material.

4. The method of claim 1, wherein said thermal process comprises baking at a temperature of about 50° C. to about 200° C.

5. The method of claim 1, wherein said removing the unreacted portion of said organic material layer uses a hydrophilic solution.

6. The method of claim 1, wherein said opening is patterned in a dielectric layer overlying said semiconductor substrate.

7. The method of claim 1, wherein said opening is etched into said semiconductor substrate.

8. The method of claim 1, wherein said sacrificial filling material over the level of said opening serves as a bottom anti-reflective coating (BARC) layer.

9. The method of claim 1, wherein said sacrificial filling material layer filling said opening is used for a dual damascene process or a bottle-shaped trench process.

10. A method of filling via openings for reducing step height difference between isolated and dense via-pattern regions, comprising:
    providing a semiconductor substrate having at least one first via opening in an isolated via-pattern region of a relative low via-pattern density and at least one second via opening in a dense via-pattern region of a relative high via-pattern density;
    forming a photoresist layer on said semiconductor substrate to partially fill said first via opening and said second via opening;
    forming an organic material on said photoresist layer to completely fill said first via opening and said second via opening;
    performing a thermal process to form a cross-linking layer between said organic material layer and said photoresist layer;
       wherein, said cross-linking layer is the reacted portion of said organic material layer; and
       wherein, said cross-linking layer combines with said photoresist layer to serve as a sacrificial filling material layer which completely fills said first via opening and said second via opening and minimizes the step height difference between said isolated via-pattern region and said dense via-pattern region; and
    removing the unreacted portion of said organic material layer from said sacrificial filling material layer.

11. The method of claim 10, wherein said organic material layer comprises WASOOM (water-soluble organic over-coating material).

12. The method of claim 10, wherein said organic material layer comprises RELACS (Resolution Enhancement Lithography Assisted by Chemical Shrink) material.

13. The method of claim 10, wherein said thermal process comprises baking at a temperature of about 50° C. to about 200° C.

14. The method of claim 10, wherein said removing said unreacted portion of said organic material layer uses a hydrophilic solution.

15. The method of claim 10, wherein said first opening and said second via opening are patterned in a dielectric layer overlying said semiconductor substrate, and said sacrificial filling material layer covers said dielectric layer.

16. The method of claim 15, further comprising:
    forming a bottom anti-reflective coating (BARC) layer and a pattern photoresist layer successively overlying said sacrificial filling material layer, wherein said pattern photoresist layer comprises a first trench opening over said first via opening and a second trench opening over said second via opening;
    using said patterned photoresist layer and said BARC layer as a mask and partially etching said dielectric layer and said sacrificial filling material layer to form a first trench pattern at an upper region of said first via opening and a second trench pattern at an upper region of said second via opening; and
    removing said sacrificial filling material layer from a lower region of said first via opening and a lower region of said second via opening.

17. The method of claim 15, further comprising:
    forming a pattern photoresist layer overlying said sacrificial filling material layer, wherein said pattern photoresist layer comprises a first trench opening over said first via opening and a second trench opening over said second via opening;
    using said patterned photoresist layer and said sacrificial filling material layer over the top surface of said dielectric layer as a mask and partially etching said sacrificial filling material layer and said dielectric layer to form a first trench pattern at an upper region of said first via opening and a second trench pattern at an upper region of said second via opening; and
    removing said sacrificial filling material layer from a lower region of said first via opening and a lower region of said second via opening.

18. The method of claim 15, wherein said dielectric layer comprises $SiO_2$, carbon-doped $SiO_2$, a low dielectric constant dielectric material with k value less than about 4.0, or combinations thereof.

19. A method of filling trenches, comprising:
providing a semiconductor substrate having at least one trench etched into said semiconductor substrate;
forming a photoresist layer on said semiconductor substrate to partially fill said trench;
forming a organic material on said photoresist layer to completely fill said trench;
performing a thermal process to form a cross-linking layer between said organic material layer and said photoresist layer;
  wherein, said cross-linking layer is the reacted portion of said organic material layer; and
  wherein, said cross-linking layer combines with said photoresist layer to serve as a sacrificial filling material layer that completely fills said trench;
removing the unreacted portion of said organic material layer from said sacrificial filling material layer;
partially removing said sacrificial filling material layer from an upper region of said trench to expose a sidewall at the upper region of said trench;
forming a dielectric spacer on the exposed sidewall of said trench; and
removing said sacrificial filling material layer from a lower region of said trench to expose a sidewall at the lower region of said trench.

20. The method of claim 19, wherein said organic material layer comprises WASOOM (water-soluble organic overcoating material).

21. The method of claim 19, wherein said organic material layer comprises RELACS (Resolution Enhancement Lithography Assisted by Chemical Shrink) material.

22. The method of claim 19, wherein said thermal process comprises baking at a temperature of about 50° C. to about 200° C.

23. The method of claim 19, wherein said removing said unreacted portion of said organic material layer uses a hydrophilic solution.

24. The method of claim 19, further comprising using said dielectric spacer as a mask and etching said exposed sidewall at the lower region of said trench to form a bottle-shaped trench.

* * * * *